(12) United States Patent
Lim

(10) Patent No.: US 7,981,717 B2
(45) Date of Patent: Jul. 19, 2011

(54) IMAGE SENSOR AND METHOD OF MANUFACTURING THE SAME

(75) Inventor: Su Lim, Seoul (KR)

(73) Assignee: Dongbu Hitek Co., Ltd (KR)

( * ) Notice: Subject to any disclaimer, the term of this patent is extended or adjusted under 35 U.S.C. 154(b) by 44 days.

(21) Appl. No.: 12/204,668

(22) Filed: Sep. 4, 2008

(65) Prior Publication Data

US 2009/0085078 A1    Apr. 2, 2009

(30) Foreign Application Priority Data

Sep. 27, 2007   (KR) ................ 10-2007-0097282

(51) Int. Cl.
*H01L 21/00* (2006.01)

(52) U.S. Cl. ............ 438/60; 438/59; 257/292; 257/293; 257/E27.132; 257/E27.133

(58) Field of Classification Search .................... 438/59, 438/60; 257/292, 293, E27.132, E27.133
See application file for complete search history.

(56) References Cited

U.S. PATENT DOCUMENTS

| | | | |
|---|---|---|---|
| 6,762,477 B2 * | 7/2004 | Kunikiyo | 257/506 |
| 7,154,136 B2 | 12/2006 | Cole et al. | |
| 2007/0148808 A1 * | 6/2007 | Lee | 438/69 |

* cited by examiner

*Primary Examiner* — N Drew Richards
*Assistant Examiner* — Yu-Hsi Sun
(74) *Attorney, Agent, or Firm* — Workman Nydegger

(57) ABSTRACT

An image sensor includes a pixel array including a photodiode, a peripheral region including a logic circuit, and an isolation region formed between the pixel array and the peripheral region and formed under the peripheral region to electrically isolate the pixel array from the peripheral region.

9 Claims, 3 Drawing Sheets

IMAGE SENSOR AND METHOD OF MANUFACTURING THE SAME

CROSS-REFERENCE TO RELATED APPLICATION

This application claims priority to Korean Application No. 10-2007-0097282, filed on Sep. 27, 2007, which is incorporated herein by reference in its entirety.

BACKGROUND

1. Field of the Invention

Embodiments of the present invention relate to an image sensor and a method of manufacturing the same.

2. Description of Related Art

In general, an image sensor formed as a semiconductor device for converting an optical image into an electric signal may include a charge coupled device (CCD) or a complementary metal oxide silicon (CMOS) image sensor (CIS).

A CIS may include a pixel array, each unit pixel in the array including a photodiode and a MOS transistor formed therein. Electric signals of each unit pixel may sequentially be detected by a switching method to detect an image.

The conventional CIS device may include a pixel array including photodiodes and a peripheral region including a logic circuit.

In the image sensor, the pixel array, which is a light receiving region, should be electrically isolated from a peripheral region that processes only the electric signals.

In the conventional art, however, it is difficult to completely isolate an epitaxial layer in the pixel array from that in the peripheral region. That is, leakage current and noise affect the peripheral region through a sub-epitaxial layer, i.e., the lowermost layer, of the pixel array.

SUMMARY OF SOME EXAMPLE EMBODIMENTS

In general, example embodiments of the invention relate to an image sensor capable of electrically isolating a pixel array including a photodiode from a peripheral region including a circuit for processing signals in a vertical-type CMOS image sensor and a method of manufacturing the same.

In accordance with a first embodiment, there is provided an image sensor, comprising a pixel array including a photodiode; a peripheral region including a logic circuit; and an isolation region formed between the pixel array and the peripheral region and formed under the peripheral region to electrically isolate the pixel array from the peripheral region.

In accordance with another embodiment, there is provided a method of manufacturing an image sensor comprised of a pixel array region, an isolation region and a peripheral region, the method comprising forming a pixel array within the pixel array region; forming a first isolation region to be electrically isolated from the pixel array within the isolation and the peripheral region; forming a second isolation region on a partial upper side of the first isolation region; and forming a logic circuit within peripheral region.

Because the isolation region in the disclosed embodiments is formed under the peripheral region, an improved electric isolation effect between the pixel array and the peripheral region may be attained so that leakage and noise between the two regions are reduced or removed, thereby improving performance, yield, and reliability of an image sensor product.

In addition, since the substrate resistances of NMOS and PMOS transistors in the peripheral region are reduced in the disclosed embodiments, speed and body effect may be reduced in terms of device performance.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Figure 1:
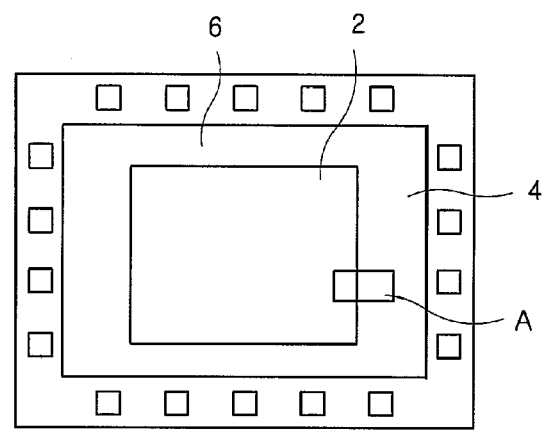
FIG. 1 is a plan view of an image sensor according to an embodiment.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

In the following detailed description, it will also be understood that when a layer is referred to as being "on/under" another layer or substrate, it can be directly on the other layer or substrate or intervening layers may also be present. Moreover, although a CMOS image sensor (CIS) is described with reference to the drawings, embodiments of the present invention are not limited to a CIS structure but also include other image sensor structures such as a charge coupled device (CCD) image sensors.

FIG. 1 is a plan view of an image sensor according to an embodiment.

As illustrated in FIG. 1, the image sensor may comprise a pixel array region 2, on which a pixel array including one or more photodiodes is formed, and a peripheral region 4, on which one or more logic circuits are formed.

Further, the image sensor may include an isolation region 6 for electrically isolating the pixel array, which may receive light on the pixel array region 2, from the peripheral region 4, which may process electric signals. The isolation region 6 may be formed between the pixel array region 2 and the peripheral region 4 while also being formed under the peripheral region 4.

Figure 2:
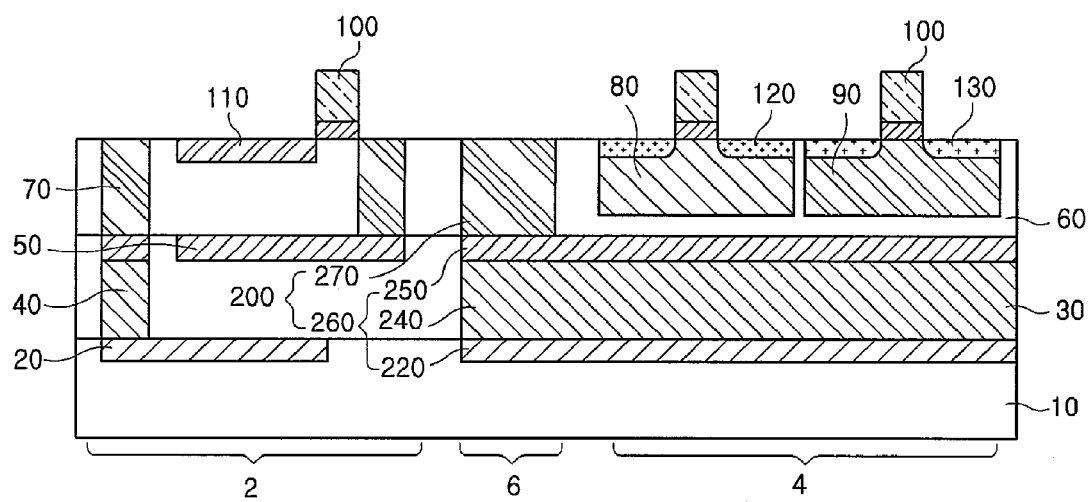
FIG. 2 is a cross-sectional view of the image sensor according to the embodiment.

FIG. 2 is a cross-sectional view illustrating a part A of the image sensor in FIG. 1.

An electric isolation effect between epitaxial layers in the pixel array region and the peripheral region 4 may be improved by using an isolation region 220, a first plug isolation region 240, and/or a green isolation region 250, one or more of which may be vertically formed through ion implantation. Thus, leakage and noise between the two electrically isolated regions may be diminished or removed and the image sensor product's performance, yield, and reliability may be improved.

One or more of the red isolation region 220, the first plug isolation region 240, and the green isolation region 250 may be formed. For example, as shown in the figures and described below, all three isolation regions 220, 240, and 250 may be formed, a combination of two of isolation regions 220, 240, and 250 may be formed, or only one of isolation regions 220, 240, and 250 may be formed.

The red isolation region 220, the first plug isolation region 240, and the green isolation region 250 are integrally referred to herein as a first isolation region 260.

A second isolation region 270 may be formed on the first isolation region 260 between the pixel array region 2 and the peripheral region 4.

Therefore, the image sensor may include the pixel array region 2, on which the pixel array including a photodiode is formed; the peripheral region 4 on which a logic circuit is formed; and the isolation region 200 formed between the pixel array region 2 and the peripheral region 4 and formed under the peripheral region to electrically isolate the pixel array from the peripheral region 4.

Reference numerals that are not described in FIG. 2 will be described hereinafter.

Figure 3:
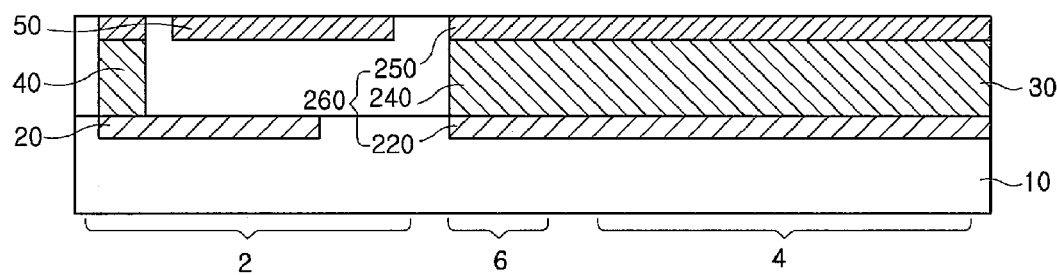
FIGS. 3 to 5 are cross-sectional views illustrating stages of a method of manufacturing the image sensor according to the embodiment.
Figure 4:
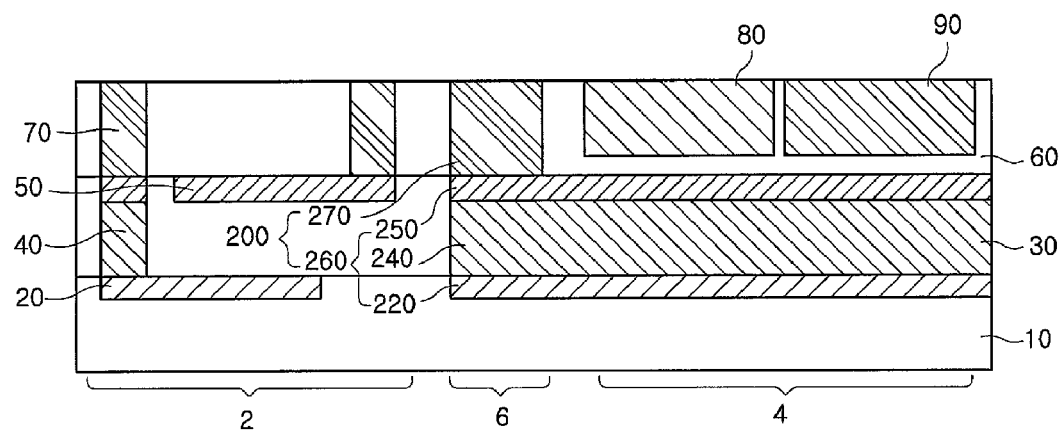
Figure 5:
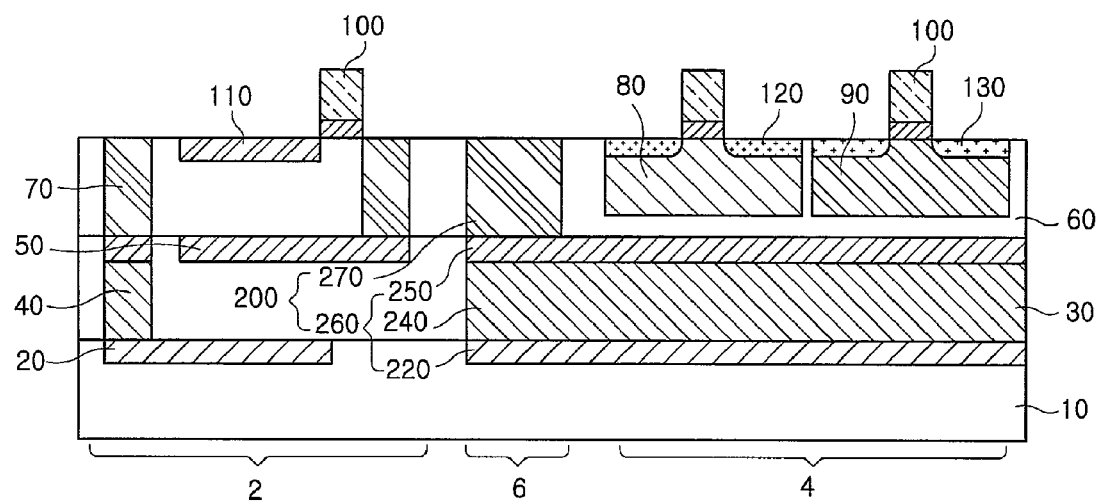

FIGS. 3 to 5 are cross-sectional views illustrating stages of a method of manufacturing the image sensor according to the embodiment shown in FIGS. 1 and 2.

First, a red photodiode 20 may be formed in a substrate 10. For example, the substrate 10 may be a P-type epitaxial substrate and the red photodiode 20 may be formed by implanting N-type ions into the P-type epitaxial substrate 10.

During formation of the red photodiode 20, the same ions implanted for the red photodiode 20 may be implanted in the isolation region 6 and the peripheral region 4 to form the red isolation region 220.

Then, after forming a first epitaxial layer 30 (e.g., a P-type epitaxial layer) on the substrate 10, ions may be implanted to form a first plug 40. For example, after growing the P-type first epitaxial layer 30 on the P-type substrate 10, N-type ions may be implanted to form the first plug 40, which may be electrically connected to the red photodiode 20.

During formation of the first plug 40, the same ions implanted for the first plug 40 may also be implanted in the isolation region 6 and the peripheral region 4 to form the first plug isolation region 240.

Then, a green photodiode 50 may be formed on the first epitaxial layer 30. For example, N-type ions may be implanted onto the P-type first epitaxial layer 30 to form the green photodiode 50.

During formation of the green photodiode 50, the same ions implanted for the green photodiode 50 may be implanted in the isolation region 6 and the peripheral region 4 to form the green isolation region 250.

In addition, during formation of the green photodiode 50, the same ions implanted for the green photodiode 50 may be implanted onto the first plug 40.

Next, as illustrated in FIG. 4, a second epitaxial layer 60 may be formed on the first epitaxial layer 30 where the green photodiode 50 is formed and ions may be implanted into the second epitaxial layer 60 to form a second plug 70. During the implantation of ions to form the second plug 70, ions can be implanted onto the first plug 40 and at least a portion of the green photodiode 50.

In addition, during formation of the second plug 70, ions may also be implanted in the isolation region 6 to form a second plug isolation region 270.

Then, a P-type well 80 and an N-type well 90 may be formed in the peripheral region 4.

Next, as illustrated in FIG. 5, gates 100 can be formed in the pixel array region 2 and in the peripheral region 4. For example, an entire surface of the substrate may be coated with a gate insulating layer and poly-silicon, which may be patterned and etched to form the gates 100.

Then, ions may be implanted into the second epitaxial layer 60 on one side of the pixel array gate to form a blue photodiode 110.

Then, N-type ions may be implanted into the P-type well 80 of the peripheral region 4 to form a first source/drain 120. Also, P-type ions may be implanted into the N-type well 90 to form a second source/drain 130.

An image sensor constructed according to the embodiments described herein, may have an improved electric isolation effect between the pixel array and the peripheral region 4 because of the isolation region formed between the pixel array region 2 and the peripheral region 4. Thus, leakage and noise between the two regions may be diminished or removed and an image sensor product's performance, yield, and reliability may be improved.

In addition, since the substrate resistances of NMOS and PMOS transistors in the peripheral region 4 can be reduced, speed and body effect may be reduced in terms of device performance.

While the present invention has been described with respect to certain embodiments, it will be apparent to those skilled in the art that various changes and modifications may be made without departing from the scope of the present invention as defined in the following claims.

What is claimed:

1. A method of manufacturing an image sensor comprised of a pixel array region, a first isolation region, a second isolation region, and a peripheral region, the method comprising:
   forming a pixel array within the pixel array region;
   forming the first isolation region under the peripheral region and between the pixel array and the peripheral region to electrically isolate the pixel array from the peripheral region;
   forming the second isolation region on a partial upper side of the first isolation region to electrically isolate the pixel array from the peripheral region; and
   forming a logic circuit within the peripheral region,
wherein the forming the pixel array comprises:
   forming a red photodiode on a sub-epitaxial layer of a first conductivity by performing implantation of ions of a second conductivity;

forming a first epitaxial layer of the first conductivity on the red photodiode;

forming a first plug in a portion of the first epitaxial layer by performing implantation of ions of the second conductivity so as to be electrically connected to the red photodiode; and forming a green photodiode on the first epitaxial layer by performing implantation of ions of the second conductivity.

2. The method of claim 1, wherein the forming of the first isolation region is performed together with the forming of the red photodiode, the first plug, or the green photodiode.

3. The method of claim 1, further comprising:

forming a second epitaxial layer on the first epitaxial layer having the green photodiode formed thereon;

forming a second plug in a portion of the second epitaxial layer by performing implantation of ions of the second conductivity so as to be electrically connected with the first plug; and forming a blue photodiode on the second epitaxial layer having the second plug formed thereon by performing implantation of ions of the second conductivity.

4. The method of claim 3, wherein the forming of the second plug is performed together with the forming of the second isolation region.

5. A method of manufacturing an image sensor comprised of a pixel array region, an isolation region, and a peripheral region, the method comprising:

forming a pixel array within the pixel array region;

forming a first isolation region to be electrically isolated from the pixel array within the isolation region and the peripheral region;

forming a second isolation region on a partial upper side of the first isolation region; and forming a logic circuit within the peripheral region, wherein the forming of the first isolation region comprises:

forming a red isolation region on a sub-epitaxial layer of a first conductivity by performing implantation of ions of a second conductivity;

forming an epitaxial layer of the first conductivity on the red isolation region; and forming a first plug isolation region on the epitaxial layer by performing implantation of ions of the second conductivity, and wherein the forming the second isolation region comprises:

forming a green isolation region in a portion of the first plug isolation region by performing implantation of ions of the second conductivity.

6. The method of claim 5, wherein the forming the pixel array comprises:

forming a red photodiode on a sub-epitaxial layer of a first conductivity by performing implantation of ions of a second conductivity;

forming a first epitaxial layer of the first conductivity on the red photodiode;

forming a first plug in a portion of the first epitaxial layer by performing implantation of ions of the second conductivity so as to be electrically connected to the red photodiode; and forming a green photodiode on the first epitaxial layer by performing implantation of ions of the second conductivity.

7. The method of claim 6, wherein the forming of the first isolation region is performed together with the forming of the red photodiode, the first plug, or the green photodiode.

8. The method of claim 6, further comprising:

forming a second epitaxial layer on the first epitaxial layer having the green photodiode formed thereon;

forming a second plug in a portion of the second epitaxial layer by performing implantation of ions of the second conductivity so as to be electrically connected with the first plug; and forming a blue photodiode on the second epitaxial layer having the second plug formed thereon by performing implantation of ions of the second conductivity.

9. The method of claim 8, wherein the forming the second plug is performed together with the forming the second isolation region.

* * * * *